Aug. 28, 1962 G. D. JONES 3,050,948

THERMOELECTRIC DEHUMIDIFIER

Filed Aug. 24, 1961 2 Sheets-Sheet 1

INVENTOR.
GARY D. JONES

BY Walter E. Rule

HIS ATTORNEY

Aug. 28, 1962 G. D. JONES 3,050,948

THERMOELECTRIC DEHUMIDIFIER

Filed Aug. 24, 1961 2 Sheets-Sheet 2

INVENTOR.
GARY D. JONES

BY Walter E. Rule

HIS ATTORNEY

United States Patent Office 3,050,948
Patented Aug. 28, 1962

3,050,948
THERMOELECTRIC DEHUMIDIFIER
Gary D. Jones, Louisville, Ky., assignor to General Electric Company, a corporation of New York
Filed Aug. 24, 1961, Ser. No. 133,629
3 Claims. (Cl. 62—3)

The present invention relates to thermoelectric dehumidifying apparatus for removing water or other vapor from air.

In previously known thermoelectric dehumidifiers, it has been the practice to arrange series connected thermoelectric cooling elements in the form of a panel with one set of junctions on one side of the panel and the other set on the opposite side. Upon passage of a direct current through the elements, one side of the panel is cooled and absorbs heat and the other side becomes hot and rejects heat. In such known devices the elements have been embedded in a suitable insulating material forming an air-impervious barrier between the two sets of junctions and the air stream to be dehumidified has been passed first over the cooled side of the panel for condensation and removal of moisture and then over the hot side of the panel for warming of the cooled air and removal of the heat from the panel. In the operation of units of this type, there may be a significant loss of heat through the insulation separating the hot and cold sides which will reduce the performance of the dehumidifier. Also, a duct arrangement is required to direct the air from the cooling side of the panel to the hot side with resultant pressure losses and extra space requirements. In addition, a solid panel arrangement requires rather high air velocities and substantial heat exchange surfaces in the form of fins or the like particularly on the hot side of the panel which result in further pressure losses and air flow noises.

It is a general object of the present invention to provide an improved thermoelectric dehumidifier having improved performance characteristics.

Another object of the invention is to provide a thermoelectric dehumidifier which does not require any duct work for directing the circulation of the air being treated from the cold junctions of the unit to the warm junctions.

Another object of the present invention is to provide a thermoelectric unit which is particularly adapted for use in a dehumidifier and which is self-supporting and of a construction such that the stresses on the thermoelectric joints between the thermoelectric elements forming part of the unit are held to a minimum.

Further objects and advantages of the present invention will become apparent from the following description and the features of novelty which characterize the invention will be pointed out with particularity in the claims annexed to and forming a part of this specification.

In carrying out the objects of the present invention, there is provided a thermoelectric dehumidifier comprising a thermoelectric unit including a plurality of P and N type thermoelectric elements alternately arranged in a plurality of horizontally spaced parallel rows with the elements in each row in substantially axial alignment with one another. Hot and cold junction members are provided for joining the ends of dissimilar elements. Each of three junction members includes vertically extending flat portions interposed between adjacent dissimilar elements with the opposite sides of the flat portions contacting and electrically connected to the ends of the adjacent elements whereby the elements are connected in series through the junction members. Passage of a direct current through the series connected elements results in every other junction becoming a hot junction and the intermediate junctions cold junctions. The cold junction members include vertical fins or heat absorbing portions on one side of the unit while the hot junction members include more extensive fin sections which are integral with the flat portions thereof and which are disposed on the other side of the unit. Each of the hot junction fin sections comprises spaced resilient side portions which are adapted to be connected to side portions of adjacent hot junction members by means of an electrically insulating material. When so connected, these side portions are adapted to maintain the various connections between the junction members and the elements under compression. In a preferred embodiment of the present invention, the hot junctions in each row of thermoelectric elements are also secured to the hot junctions of adjacent rows of thermoelectric elements by an electrically insulating means whereby there is provided a unitary structure in which the insulated but interconnected hot junctions provide an open rigid framework which protects the thermoelectric elements from stresses resulting from the handling or operation of the unit and through which the air being dehumidified can readily pass.

For a better understanding of the invention reference may be had to the accompanying drawing in which.

Figure 1:
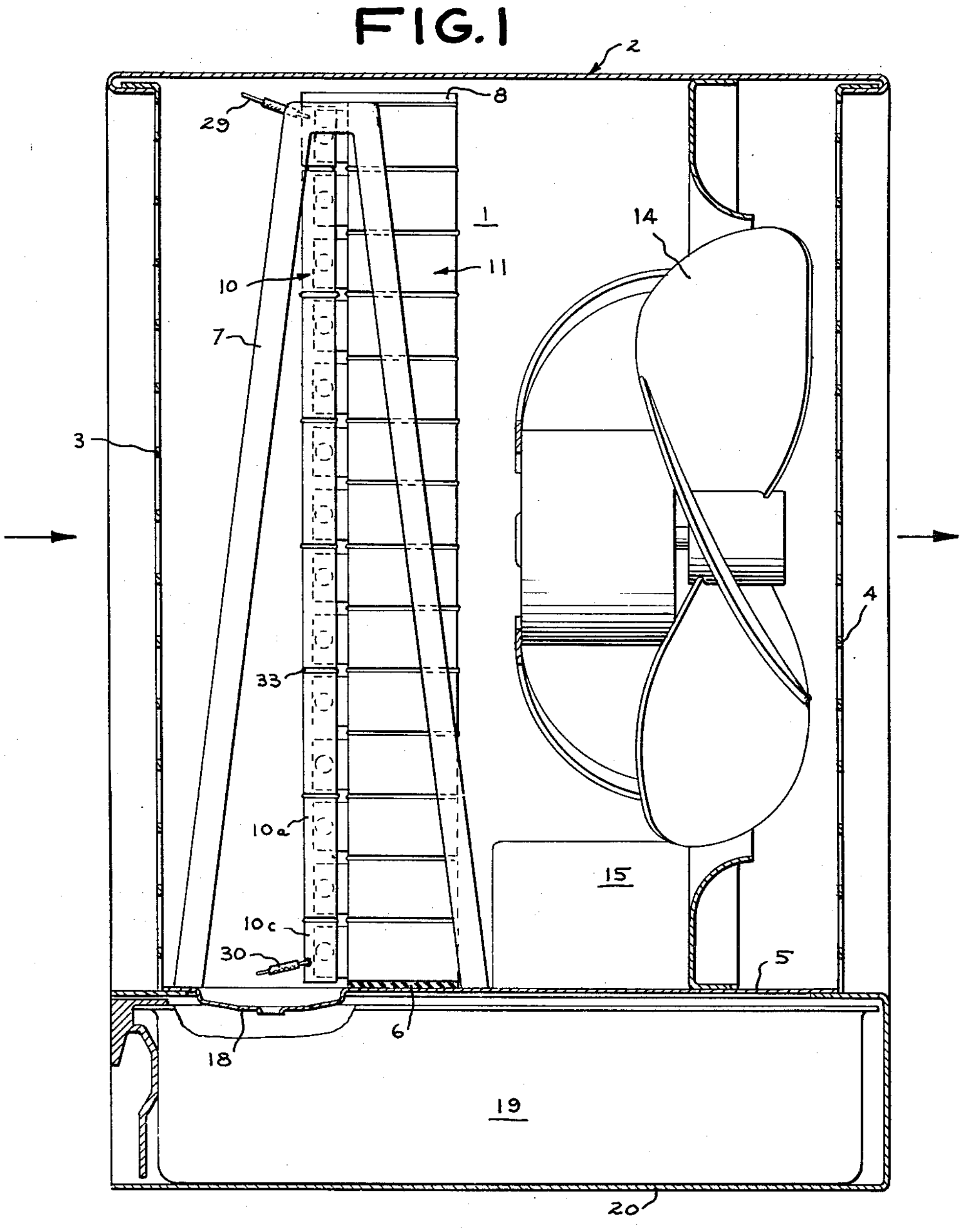
FIG. 1 is a side elevational view partly in section of a dehumidifier embodying the present invention.

With reference to FIG. 1 of the drawing, there is shown a thermoelectric dehumidifier including a vertically arranged thermoelectric unit 1 of substantially rectangular shape housed within the casing 2 having grilles 3 and 4 forming the rear and front walls of the casing. The unit 1, which is supported on a platform 5 and is insulated therefrom by means of a rubber pad 6, is maintained in an upright position by means of a frame including opposed side members 7 (only one of which is shown) and a cap or cross member 8 composed of insulating material and secured to the upper ends of the side members 7. As the side members 7 are spaced from the unit 1 and as the unit is in contact only with the insulating member 8 and the rubber pad 6, it is completely insulated from the casing 2 and the components thereof.

The thermoelectric unit 1 comprises a plurality of P and N type thermoelectric elements alternately arranged and connected in series by alternate cold junction members 10 and hot junction members 11 respectively extending outwardly from the unit on opposite sides thereof. More specifically the cold junction members 10 extend frontwardly from the unit and the hot junction members rearwardly whereby air, drawn through the front grille 3 and through the thermoelectric unit 1 by means of a fan 14 provided within the casing 2, flows first over the cold junctions 10 and then over the hot junctions 11 before being finally discharged by the fan through the rear grille 4.

Also included within the casing is a suitable direct current power supply means 15 for converting an alternating current source of power to direct current. A drain trough 18 formed in the platform 5 below the cold junctions 10 of the unit 1 is provided for collecting condensate flowing from the cold junctions and for discharging the condensate into a receptacle 19 resting on the base 20 of the casing below the platform 5.

Figure 3:
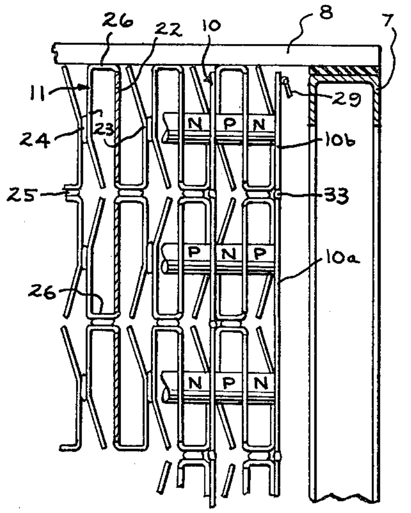
FIG. 3 is a view taken generally along line 3—3 of FIG. 2.

As is shown more particularly in FIG. 3 of the drawing, the P and N type elements are alternately arranged in a plurality of rows and the rows are vertically spaced one above another with the elements in each row being in substantially axial alignment. The hot and cold junction members 10 and 11 each include vertically extending flat portions alternately interspersed between and soldered to adjacent P and N type elements.

Figure 2:
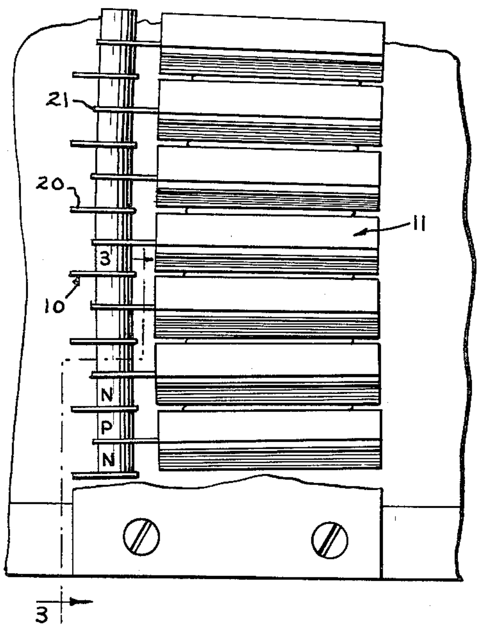
FIG. 2 is a fragmentary top view of a portion of the thermoelectric unit forming part of the present invention.

As is shown in FIGS. 1 and 2 of the drawing, the cold junction members include extension or fin portions 20 projecting from the front side of the unit in the direction of the air intake grille 3 and are designed to provide the surface area necessary for cooling the incoming air stream and condensing moisture on the cold junction members.

The hot junction members have a much larger surface area in order to provide the required larger heat dissipating surface. In addition to the vertical portion or sections 21 interposed between the adjacent P and N type elements, each of these hot junctions includes an outwardly extending fin section 22 of generally S-shaped configuration and including a vertical connecting segment 22 and resilient side portions 23 spaced from the segment 22 and on the opposite sides thereof.

In addition to providing the required heat dissipating surface for the hot junctions, the resilient side portions or arms 23 provide means for connecting each hot junction member to adjacent hot junction members by means of an insulating fastening means 24, such as a layer or film of epoxy resin compound, for the purpose of maintaining the soldered joints between the various elements and the junction members under compression or at least free from any tension forces which would tend to damage either the soldered joints between the elements and the junctions or the elements themselves.

The insulated connection provided by the insulating adhesive material 24 between the adjacent hot junctions in each row of thermocouples also serves to bond each row into an integral self supporting portion of the total unit. In order to secure the various rows to one another, the upper and lower portions of each hot junction are adhesively secured to the adjacent junctions in the adjacent rows by means of an electrically insulating means 25, such as a layer of epoxy compound. In order to provide a substantial surface area for this joining purpose, the resilient side portions 23 of each of the hot junctions are preferably connected to the fin segment 22 by means of flattened loops or return bends 26 and the hot junction members are so constructed that a flattened return bend on each hot junction in one row will be opposite to a flattened return bend in the hot junction of an adjacent row.

Figure 4:
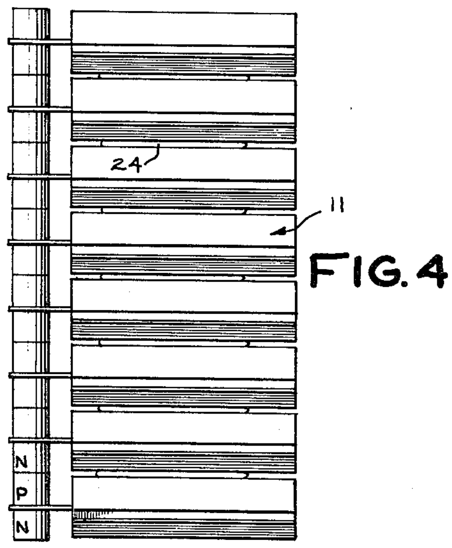
FIG. 4 is a sub-assembly view similar to that of FIG. 2 illustrating one step in a preferred method of manufacturing the thermoelectric unit forming part of the present invention.

The manner in which the adjoined side portions 23 of the hot junction members serve to maintain the thermo elements and their joints under a compressive force when the hot junctions are adhesively secured to one another will become more apparent from a consideration of one technique which can be employed in making a thermoelectric unit embodying the present invention. By this method, a P type element and an N type element are soldered to opposite sides of the vertically extending flat portion 21 of a hot junction member 11 and a plurality of these assemblies are then arranged in side-by-side relationship as for example in the form of a stack as shown in FIG. 4 with the adhesive layers 24 interposed between the side portions 23 of adjacent hot junction members. The space between the opposed side portions 23 of each hot junction member, as compared with the lengths of the P and N type elements, are such that when the stack is arranged as shown in FIG. 4 with the hot junction members secured together by insulating means 24, the elements on each hot junction member will be in contact with an opposite type element secured to the adjacent hot junction members. Upon curing or hardening, the electrically insulating material 24 provides the sole means for rigidly securing all of the elements together. In other words the elements per se and their soldered joints with the flat portion 21 do not impart any strength or rigidity to the rows of elements.

In the next step involved in the manufacture of the unit and due to the resilient or spring-like characteristics of the side portions 23 of the hot junction members, the contacting P and N type units of adjacent assemblies or couples are separated or spread apart a distance sufficient to permit insertion of the cold junction members 10 between these elements. The ends of the cold junctions 10 are then soldered to the respective P and N type elements in contact therewith to provide a structure which, as is illustrated in FIG. 2 of the drawing, may bow slightly as a result of the interspersing of the cold junction elements 10 into the sub-assembly shown in FIG. 4. By this method of construction, and due to the resilient or spring-like characteristics of the side portions 23 of the hot junction members, all of the forces on the joints between the thermoelectric elements and the junction members as well as on the elements themselves are compressive in nature.

For the purpose of electrically connecting adjacent rows of elements to form a series electrical circuit through the entire unit the end cold junction member 10*a* in each row of elements is either provided in a sufficient vertical dimensions to overlap the corresponding cold junction member of the next one of the adjacent rows or, as shown in FIG. 3, is formed as a single continuous strip common to two rows. By employing means such as a continuous strip 10*a* for joining one end of two adjacent rows and by thereafter rigidly securing the remaining portions of the rows together by means of the electrically insulating joining means 25 between adjacent hot junction members, there is provided a single rigid unit in which all of the individual thermocouples are series connected for the flow of a direct current in a zig-zag row-to-row direction. For example, by connecting the single cold junction member 10*b* at one end of the upper row through a conductor 29 to one terminal (not shown) of the power pack 15 and connecting the most remote cold junction member 10*c* at the bottom of the unit to the other terminal through a connector 30, power can be supplied to the unit for the flow of a direct current through the unit in a zig-zag path, it being understood that the direct current power supply is so connected to the unit that the hot junction members 11 are heated and the cold junction members 10 are cooled by the current flow.

In order to assure electrical separation of the cold junction fins 10 in the various rows, a layer of epoxy compound 33 is also placed in each of the spaces between the fins 10 in the various rows, which fins as shown in FIG. 3 are in vertical alignment. Also if desired the entire thermoelectric unit 1 can be coated with an insulating varnish both for the purpose of electrically insulating the unit and for the purpose of protecting it from corrosion.

A significant feature of the present invention is the fact that the thermoelectric unit does not contain any solid insulation in the spaces around the elements and between the hot and cold junctions as is the case with prior dehumidifiers employing panel type thermoelectric units. Rather the spaces between the hot and cold junctions members provide air paths for the flow of air or other gas through the unit. In fact, the thermoelectric unit has an appearance similar to a conventional fin and tube heat exchanger. The air stream passes first over the cold fins 10 where it deposits its moisture on the fins. This moisture runs down the vertically aligned cold fins to be collected on the drain trough 18 from which it flows into the receptacle 19. The cooled air then flows around the thermoelectric elements thereby cooling them before it passes over the hot junction fins to remove the hot junction heat and to be restored to substantially its initial temperature.

By this construction and operation of the unit, there is a significant improvement in the performance of the dehumidifier over the prior thermoelectric dehumidifiers of the panel type. In these prior humidifiers there was a significant loss of heat through the insulation separating the hot side from the cold side with the result that the cold junctions tended to run warmer and the hot junctions cooler than would otherwise be expected. In the present units, since the air stream flows over the entire surface area of the hot junctions, the size of which is not limited by any duct or panel surface limitations, the hot junctions are continuously maintained at a suitable operating temperature. Furthermore, the direct flow of cooled air over the thermoelectric elements improves their individual performances by removing some of the internally generated Joule heat. In addition the very short current paths between adjacent elements permits the operation of the cooling unit at higher currents thus requiring a smaller number of couples for equivalent dehumidification. Also because of the fact that the air flow is straight through the unit from the cold side to the hot side, maximum dehumidifying performance is obtained without turning or reversing the air flow and at a relatively low air velocity. Since a lower air velocity can be employed, the dehumidifier of the present invention therefore requires less fan motor power and is of quieter operation than the usual panel type dehumidifiers.

It will be understood of course that while the hot fins in the illustrated embodiment of the invention are generally S-shaped any suitable shape can be employed provided the configuration provides adequate heat dissipating area and resilient portions capable of maintaining the thermoelectric joints free of tension stresses. It is therefore intended by the appended claims to cover all such modifications of the present invention as are within the spirit and scope of the invention.

What I claim as new and desire to secure by Letters Patent of the United States is:

1. A thermoelectric dehumidifier comprising a thermoelectric unit including a plurality of P and N type thermoelectric elements alternately arranged to form a plurality of horizontally spaced parallel rows of elements with the elements in each row being in substantially axial alignment with one another, junction members having vertically extending flat portions interposed between said elements with the opposite sides thereof contacting and series connecting adjacent elements to form a set of hot junctions and a set of cold junctions, the junction members forming said hot junctions including fin sections integral with the flat portions thereof and disposed on one side of said unit, each of said fin sections comprising spaced side portions, electrically insulating means securing said side portions of each hot junction member to the side portion of an adjacent hot junction member, said joined side portions being adapted to maintain the connections between said junction members and said elements under compression.

2. A thermoelectric dehumidifier comprising a thermoelectric unit including a plurality of P and N type thermoelectric elements alternately arranged to form a plurality of horizontally spaced parallel rows of elements with the elements in each row being in substantially axial alignment with one another, junction members having vertically extending flat portions interposed between said elements with the opposite sides thereof contacting and series connecting adjacent elements to form a set of hot junctions and a set of cold junctions, the junction members forming said hot junctions including fin sections integral with the flat portions thereof and disposed on one side of said unit, each of said fin sections comprising resilient portions, electrically insulating means securing said resilient portions of each hot junction member to the resilient side portion of an adjacent hot junction member, said joined resilient portions being adapted to maintain the connections between said junction members and said elements free of tension forces tending to fracture said connections.

3. A thermoelectric dehumidifier comprising a thermoelectric unit including a plurality of P and N type thermoelectric elements alternately arranged to form a plurality of horizontally spaced parallel rows of elements with the elements in each row being in substantially axial alignment with one another, junction members having vertically extending flat portions interposed between said elements with the opposite sides thereof soldered to and series connecting adjacent elements to form a set of hot junctions and a set of cold junctions, the junction members forming said hot junctions including resilient S-shaped fin sections integral with the flat portions thereof and disposed on one side of said unit, electrically insulating means securing the free end sections of each hot junction member to a free end section of an adjacent hot junction member, said joined hot junctions being adapted to maintain the connections between said junction members and said elements under compression.

References Cited in the file of this patent

UNITED STATES PATENTS

| | | |
|---|---|---|
| 2,919,553 | Fritts | Jan. 5, 1960 |
| 2,944,404 | Fritts | July 12, 1960 |
| 2,980,746 | Claydon | Apr. 18, 1961 |